US009778313B2

(12) United States Patent
Chen et al.

(10) Patent No.: US 9,778,313 B2
(45) Date of Patent: Oct. 3, 2017

(54) DEVICES UNDER TEST

(71) Applicant: TEXAS INSTRUMENTS INCORPORATED, Dallas, TX (US)

(72) Inventors: Min Chen, Allen, TX (US); Vijay Kumar Reddy, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 352 days.

(21) Appl. No.: 14/479,940

(22) Filed: Sep. 8, 2014

(65) Prior Publication Data

US 2016/0069950 A1 Mar. 10, 2016

(51) Int. Cl.
*G01R 31/28* (2006.01)
*G01R 29/26* (2006.01)
*G01R 31/26* (2014.01)

(52) U.S. Cl.
CPC ..... *G01R 31/2855* (2013.01); *G01R 31/2868* (2013.01); *G01R 29/26* (2013.01); *G01R 31/2623* (2013.01)

(58) Field of Classification Search
CPC ......... H01L 22/34; H01L 22/14; H01L 23/58; H01L 22/20; H01L 29/94; G01R 31/2621; G01R 31/26; G01R 31/2642; G01R 31/2884
USPC ... 324/750.05, 762.02, 762.09, 73.1, 750.03, 324/750.01, 537, 500, 762.01, 750.3, 324/762.05, 756.01, 523, 555, 750.02, 324/750.06, 750.16, 762.03; 702/117, 702/118, 65; 438/17, 18; 716/100; 361/101
See application file for complete search history.

(56) References Cited

U.S. PATENT DOCUMENTS

| | | | |
|---|---|---|---|
| 6,329,831 B1 * | 12/2001 | Bui | G01R 31/2879 324/750.03 |
| 7,103,861 B2 | 9/2006 | Ang et al. | |
| 7,456,628 B2 | 11/2008 | Suzuki | |
| 7,724,017 B2 | 5/2010 | Zhao | |
| 8,692,571 B2 | 4/2014 | Lai et al. | |
| 2010/0318313 A1 * | 12/2010 | Agarwal | G01R 31/318511 702/117 |

(Continued)

OTHER PUBLICATIONS

Sato, T.; Kozaki, T.; Uezono, T.; Tsutsui, H.; Ochi, H., "A device array for efficient bias-temperature instability measurements," Solid-State Device Research Conference (ESSDERC), 2011 Proceedings of the European , vol., No., pp. 143-146, Sep. 12-16, 2011 doi: 10.1109/ESSDERC.2011.6044214.

*Primary Examiner* — Melissa Koval
*Assistant Examiner* — Nasima Monsur
(74) *Attorney, Agent, or Firm* — John R. Pessetto; Charles A. Brill; Frank D. Cimino

(57) ABSTRACT

A system can include a plurality of device under test (DUT) cells. Each DUT cell can include a DUT and a plurality of switches configured to control a flow of current to the DUT. The system can further include a controller configured to execute a plurality of test to the plurality of DUTs in the plurality of DUT cells. Each of the plurality of tests comprises applying a measurement condition to a given DUT of the plurality of DUTs and concurrently applying a stress condition to the remaining DUTs of the plurality of DUTs, wherein the plurality of tests can provide measurements sufficient to determine a bias thermal instability and a time dependent dielectric breakdown of the given DUT.

17 Claims, 9 Drawing Sheets

(56) References Cited

U.S. PATENT DOCUMENTS

2012/0245879 A1\* 9/2012 Mikkola ................. G06F 19/00
   702/117
2013/0015876 A1\* 1/2013 Lai ..................... G01R 31/2642
   324/762.01

\* cited by examiner

DEVICES UNDER TEST

TECHNICAL FIELD

This disclosure relates to testing semiconductor devices.

BACKGROUND

Bias temperature instability (BTI) is a reliability issue in semiconductor device manufacturing, such as the manufacturing of metal-oxide-semiconductor field-effect transistors (MOSFETs). BTI manifests as an increase in a threshold voltage and a consequent decrease in drain current and transconductance of a MOSFET. The degradation exhibits a power-law dependence on time. BTI is of a concern in both p-channel metal-oxide-semiconductor (MOS) devices as well as n-channel MOS devices.

Random Telegraph Noise (RTN) is a type of electronic noise that occurs in semiconductors. RTN can also be referred to as burst noise, popcorn noise, impulse noise, bi-stable noise, or random telegraph signal (RTS) noise. RTN can include sudden step-like transitions between two or more discrete voltage or current levels, as high as several hundred microvolts, at random and unpredictable times. Each shift in offset voltage or current often lasts from several milliseconds to seconds.

Time-dependent dielectric breakdown (TDDB) or time-dependent gate oxide breakdown refers to a failure mechanism in MOSFETs, when the gate oxide breaks down as a result of long-time application of a relatively low electric field (as opposite to immediate breakdown, which is caused by a strong electric field). TDDB can be caused by a formation of a percolating conducting path through the gate oxide to substrate or the source and drain junctions, when MOSFETs are operated close to or beyond their specified operating voltages.

SUMMARY

This disclosure relates to testing semiconductor devices. One example relates to a system that includes a plurality of device under test (DUT) cells. Each DUT cell can include a DUT and a plurality of switches configured to control a flow of current (or a voltage applied) to the DUT, and each DUT comprises an electronic component. The system can further include a controller configured to execute a plurality of tests on the plurality of DUTs in the plurality of DUT cells. Each of the plurality of tests can include an applying a measurement condition to a given DUT of the plurality of DUTs and concurrently applying a stress condition to the remaining DUTs of the plurality of DUTs. The plurality of tests can provide measurements sufficient to determine a bias thermal instability and a time dependent dielectric breakdown of the given DUT.

Another example relates to a method that includes applying a stress condition to a plurality of DUTs in an array of DUTs. The method can also include applying a measurement condition to a given DUT in the array of DUTs while currently maintaining the stress condition on the remaining DUTs in the plurality of DUTs. The method can also include repeating the applying of the measurement condition while maintaining the stress condition for each DUT in the array of DUTs. The method can further include determining degradation parameters of each DUT in the array of DUTs.

Yet another example relates to a method that includes applying a first test condition to a plurality of DUTs. The first test condition can include applying a first stress condition to each of the plurality of DUTs. The first stress condition can be configured to apply a stress voltage to each of the plurality of DUTs that can be higher or lower than a rated voltage of each of the plurality of DUTs. The first test condition can also include applying a first measurement condition to a given DUT of the plurality of DUTs while maintaining the first stress condition at each of the remaining DUTs of the plurality of DUTs. The first test condition can further include measuring a drain current at the given DUT and repeating the applying of the first measuring condition while maintaining the first stress condition for each DUT in the plurality of DUTs. The method can also include applying a second test condition to the plurality of DUTs. The second test condition can include applying a second stress condition to each of the plurality of DUTs. The second stress condition can be configured to apply the stress voltage to each of the plurality of DUTs. The second condition can also include applying a second measurement condition to a given DUT of the plurality of DUTs while maintaining the first stress condition at each of the remaining DUTs of the plurality of DUTs. The second measuring condition can further include measuring a gate current at the given DUT and repeating of the applying of the second measuring condition while maintaining the second stress condition for each DUT in the plurality of DUTs.

DETAILED DESCRIPTION

This disclosure relates to systems and methods for applying stress tests (e.g., reliability tests) and measuring operating characteristics of semiconductor devices to derive expected degradation parameters (e.g., reliability parameters) for devices that are fabricated in a manner similar to the semiconductor devices. For example, the stress test can include applying a stress condition to a plurality of devices under test (DUTs) in an array of DUTs. The stress condition can include applying a voltage higher or lower than a rated voltage for the DUTs. The stress test can also include applying a measurement condition to given DUT in the array of DUTs while currently maintaining the stress condition on the remaining DUTs in the plurality of DUTs and repeating the applying for each DUT in the array of DUTs. Performance characteristics for each DUT can be measured and recorded. Such maintenance of the stress condition at the remaining DUTs can improve accuracy of the recorded measurements. The measurements can be employed to determine degradation parameters of each DUT in the array of DUTs. Moreover, upon determining the degradation parameters for each of the plurality of DUTs, statistical analysis can be employed to predict the degradation parameters for devices that are fabricated in a manner similar to the DUTs.

Figure 1:
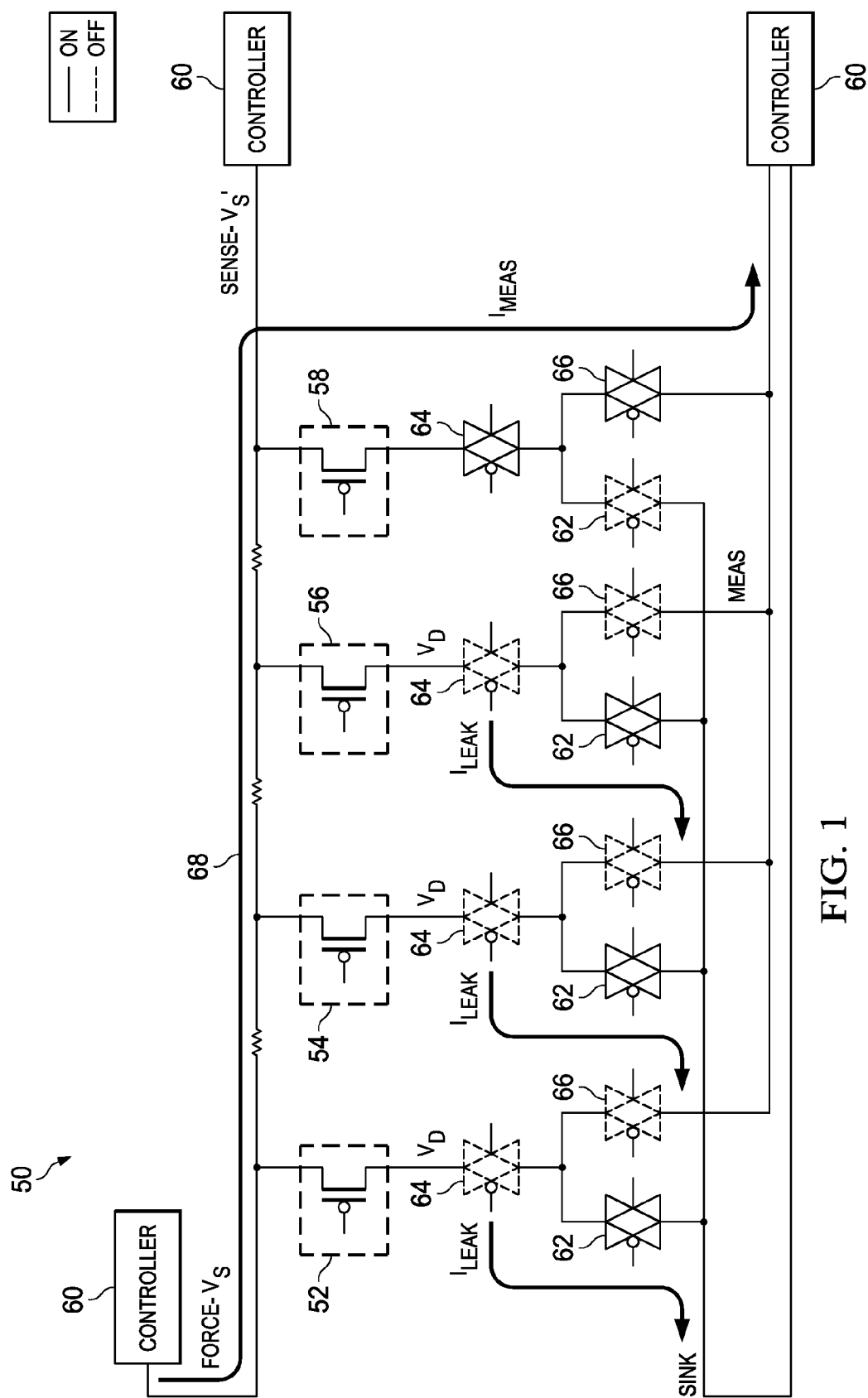
FIG. 1 illustrates an example of a system that can test a plurality of devices.

FIG. 1 illustrates an example of a system 50 that can test a plurality of devices to determine expected degradation parameters of devices. Each such device can be referred to as a device under test (DUT) 52, 54, 56 and 58. In the present example, each DUT 52, 54, 56 AND 58 is illustrated as being a p-channel metal-oxide-semiconductor field effect transistor (MOSFET) or simply a p-MOS, but in other examples, other devices could be tested, such as an n-channel MOSFET (n-MOS) could be tested as well.

In the example illustrated in FIG. 1, there are four DUTs 52, 54, 56 and 58 that can be tested in parallel. However, in other examples, more or less DUTs could be tested. In particular, as explained herein, the DUTs 52, 54, 56 and 58 can be arranged in an array of test units. The system 50 can include a controller 60 configured to provide a force voltage (labeled in FIG. 1 as "FORCE-$V_S$"). For purposes of simplification of explanation, multiple instances of the controller 60 are illustrated. However, it is to be understood that the controller 60 can be implemented as a single, integrated unit or multiple units. The controller 60 can be implemented, for example, as a hardware device, such as an application specific integrated circuit (ASIC) chip, a microcontroller, a computing device, etc. The controller 60 can also receive a sense signal (labeled in FIG. 1 as "SENSE-VS"). The controller 60 can be configured to compare the force signal to the sense signal to determine a current-resistance (IR) drop across the DUTs 52, 54, 56 and 58.

The system 50 can include a plurality of switches. In the present example, there are three switches associated with each DUT 52, 54, 56 and 58, namely, a leakage switch 62, and two measurement switches 64 and 66. However, in other examples, more or less switches can be employed.

During a test, the controller 60 can be configured to apply a stress condition to each of the DUTs 52, 54, 56 and 58. As explained herein, there can be different stress conditions that can be applied depending on the type of testing desired. In a stress condition, each of the DUT 52, 54, 56 and 58 has a signal causing current to flow from a drain to a source of the p-MOS. After a period of time (e.g., about 24 hours), operational characteristics of each DUT 52, 54, 56 and 58 can be measured individually.

In the example illustrated in FIG. 1, the controller 60 applies a measurement condition to the DUT 58. To apply the measurement condition, both of the measurement switches 64 and 66 associated with the DUT 58 can be turned on (e.g., closed) by the controller 60, and the sink switch 62 can be turned off (e.g., opened). Moreover, in such a situation, a measurement current (labeled in FIG. 1 as "$I_{MEAS}$") that is represented by the arrow 68 can be received and measured at the controller 60 at a measurement rail (labeled in FIG. 1 as "MEAS"). Concurrently, as is illustrated, the measurement switches 64 and 66 of the remaining DUTs 52, 54 and 56 can remain off (or be turned off), and the leakage switch 62 can remain on to allow a leakage current ($I_{LEAK}$) to flow to a sink rail (labeled in FIG. 1 as "SINK") that can be received at the controller 60, or in some examples, coupled to an electrically neutral node (e.g., ground). Thus, by employment of the system 50, operational characteristics of a single DUT 58 can be measured while the remaining DUTs 52, 54 and 56 can have a stress condition applied. Such operational characteristics can include, but are not limited to drain current to voltage ($I_D$-V), gate current to voltage ($I_G$-V), a threshold voltage ($V_{TH}$), a drain saturation current ($I_{DSAT}$), a drain linear current ($I_{DLIN}$ at a nominal operating voltage ($V_{NOM}$), etc. Accordingly, the measurement process can be repeated for each of the remaining DUTs 52, 54 and 56 such that the operational characteristics for each of the DUTs 52, 54, 56 and 58 can be determined.

Determination of the operational characteristics of each of the DUTs 52, 54, 56 and 58 can be analyzed to determine degradation parameters (e.g., reliability parameters) for each of the DUTs 52, 54, 56 and 58. Such degradation parameters can include, for example, Bias Temperature Instability (BTI), random telegraph noise (RTN), Time-dependent dielectric breakdown (TDDB), process variations (t0), etc. Moreover, the measured and determined degradation parameters can be statistically analyzed to predict expected degradation parameters for semiconductor devices that are fabricated in a manner similar to the DUTs 52, 54, 56 and 58.

Figure 2:
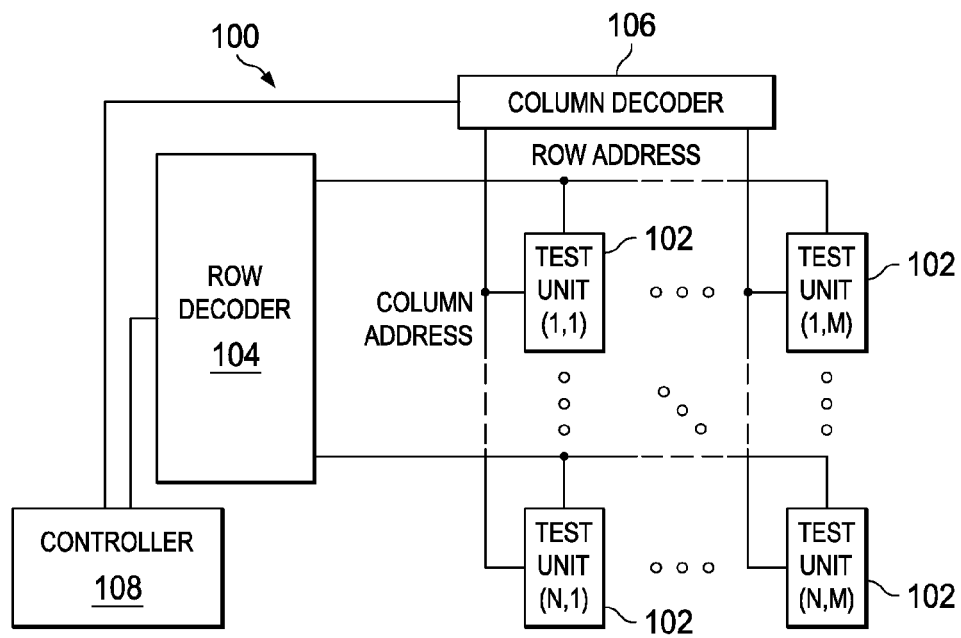
FIG. 2 illustrates an example of a system that can test an array of devices.

FIG. 2 illustrates an example of a system 100 that implements an array of test units 102 to predict degradation parameters for circuit components. The array can have, for example, N×M number of test circuits, where N and M are integers greater than or equal to two. In some examples, the array of test circuits can be an 8×8 array, a 100×100 array, etc. The system 100 can be implemented, for example, as a circuit on a die of a semiconductor wafer. In some examples, the system 100 can be a sub-system of a larger circuit. In other examples, the system 100 can be implemented as a stand-alone circuit configured to test the reliability of semiconductor devices.

The system 100 can include a row decoder 104 and a column decoder 106 that can individually address any of the N×M test units 102. Each of the test units 102 is labeled with an identifying row and column number. For example, the test unit 102 at row 'N' and column '1' is labeled as TEST UNIT (N,1). Similarly, the test unit 102 at row '1' and column 'M' is labeled as TEST UNIT (1,M).

Each test unit 102 can be configured to stress an associated device under test (DUT) for a given period of time. Each test unit 102 can also be configured to measure degradation of the associated DUT. Such degradation can include, for example, BTI, including negative BTI (NBTI) and positive BTI (PBTI), RTN and/or time-dependent TDDB. Each of the test units 102 can be configured such that multiple stress tests can be performed on the associated DUT. The system 100 can be configured such that a test unit 102 addressed by the row decoder 104 and the column decoder 106 can be configured to switch from a stress condition (or one of a plurality of stress conditions) to a measurement mode (or one of a plurality of measurement conditions). Each of the row decoder 104 and the column decoder 106 can be controlled, for example, by a controller 108. The controller 108 can be implemented, for example, as an ASIC, a microcontroller, a computing device, etc. The system 100 can be configured such that, when the given test unit 102 is switched to the measurement condition, the other test units 102 in the system 100 can remain in the stress condition, so as to prevent an unwanted recovery of DUTs while measuring the DUT associated with the given test unit 102.

Data measured and recorded by the controller 108 can be employed to determine degradation parameters for each DUT included in the array of test units 102. Accordingly, statistical analysis of the results of the stress test at each DUT at each of the N×M test units 102 can be employed to determine predictive degradation parameters and/or reliability ratings for semiconductor devices that are fabricated in a manner similar to the fabrication methods employed to manufacture the DUTs associated with the test units 102.

Figure 3:
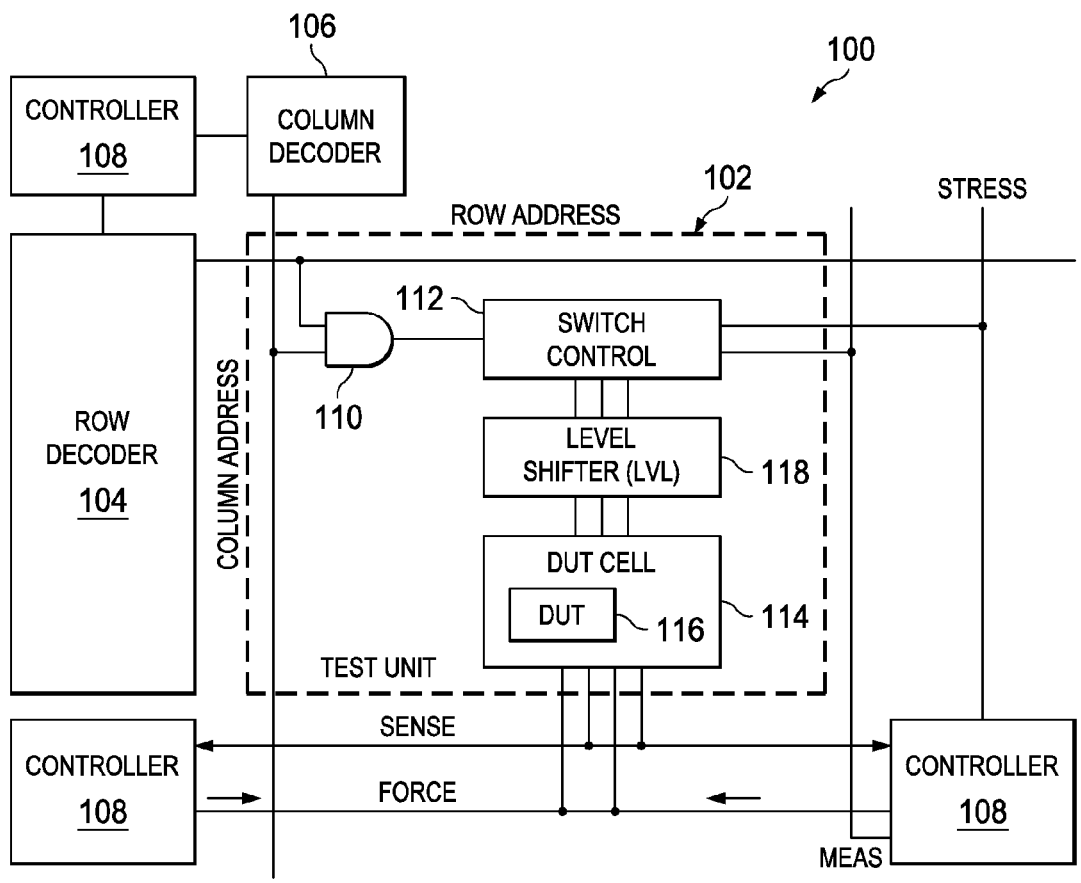
FIG. 3 illustrates an example of a test unit illustrated in FIG. 2.

FIG. 3 illustrates a block diagram of details of a single test unit 102 that could be employed, for example to implement any of the N×M test units 102 of FIG. 2. For purposes of simplification of explanation, the same reference numbers are employed in FIGS. 2 and 3 to denote the same structure. The test unit 102 can receive an address signal from a row decoder 104 and a column decoder 106 that could be, for example, the row decoder 104 and the column decoder 106 illustrated in FIG. 2.

The test unit 102 can include an AND gate 110 configured to receive the address signal from the row decoder 104 and the column decoder 106. Inclusion of the AND gate allows the test unit 102 to be individually addressed by row and number in an array. The test unit 102 can also include a switch control 112 that can be configured to control a plurality of switches of a DUT cell 114. The DUT cell 114 can include the switches and the DUT 116. Control of the plurality of switches of the DUT cell 114 can cause the switches to switch from one of a plurality of stress conditions to one of a plurality of measurement conditions to test different operational characteristics of the DUT 116. Such operational characteristics can include, but are not limited to drain current to voltage ($I_D$-V), gate current to voltage ($I_G$-V), a threshold voltage ($V_{TH}$), a drain saturation current ($I_{DSAT}$), a drain linear current ($I_{DLIN}$ at a nominal operating voltage ($V_{NOM}$), etc. The operational characteristics can be employed to determine degradation parameters of the DUT 116.

The test unit 102 can also include a level shifter (LVL) 118. The level shifter 118 can be configured to change voltage levels associated with switches of the DUT cell 114 to a voltage level associated with the DUT 116. For instance, the voltage level associated with the switches could be at a given voltage level (e.g., 3.3 Volts (V)) and the voltage level associated with the DUT 116 can be another voltage level (e.g., 1.2 V), which other voltage level can be lower than the given voltage level. In such a situation, stress voltages applied to the DUT 116 (e.g., 2.0 V) would have little to no degradation effect on the switches that operate at the given (higher) voltage level.

The DUT 116 can be implemented, for example, as a p-MOS 150 or an n-MOS. The switch control 112 can be configured to control a propagation of a stress signal (labeled in FIG. 3 as "STRESS"), a sense signal (labeled in FIG. 3 as "SENSE"), a force signal (labeled in FIG. 3 as "FORCE") and a measurement signal (labeled in FIG. 3 as "MEAS") to the DUT 116.

Figure 4:
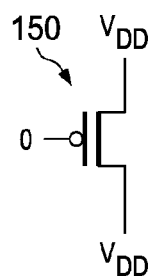
FIG. 4 illustrates an example of a semiconductor device with a stress condition applied.

In one example, the switch control 112 can be configured to apply the stress signal to the DUT 116 to put the DUT 116 in a first stress condition. FIG. 4 illustrates an example of a p-MOS 150 in the first stress condition. In FIG. 4, the p-MOS 150 is put in an "ON" state, wherein a logic '0' signal is applied to a gate of the p-MOS 150 and a positive voltage, such as a rail or pin voltage (labeled in FIG. 3 as "$V_{DD}$") is applied to a drain and source of the p-MOS 150.

$V_{DD}$ can be set to a value slightly above a normal maximum rating for the p-MOS 150 (e.g., at a stress voltage). For instance, if the p-MOS 150 is rated at 1.2 Volts (V), $V_{DD}$ can be set to about 2.0 V, such that the "stress" is applied to the p-MOS 150.

Figure 5:
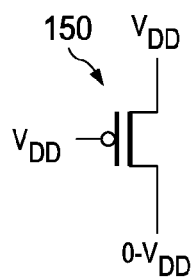
FIG. 5 illustrates an example of a semiconductor device with a recovery condition applied.

Referring back to FIG. 3, the switch control 112 can be configured to apply a recovery condition on the DUT 116, which can also be referred to as a second stress condition. FIG. 5 illustrates the p-MOS 150 illustrated in FIG. 4 in the recovery condition. In FIG. 5, the p-MOS 150 is put in the "OFF" state, wherein $V_{DD}$ is applied to the gate and drain of the p-MOS 150. Moreover, a voltage between logic '0' and $V_{DD}$ can be applied to the source of the p-MOS 150.

Referring back to FIG. 3, in a typical example test, the DUT 116 is operated in the first stress condition for a predetermined amount of time (e.g., about 24 hours). In some examples, the first stress condition can be applied while applying external heat to the test unit 102 (as well as the system 50 of FIG. 2). For instance, the first stress test can be applied while baking the test unit 102 in an oven to simulate aging effects.

Figure 6A:
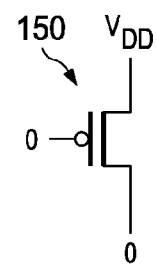
FIG. 6A-6D illustrates examples of a semiconductor device with a measurement condition applied.
Figure 6B:
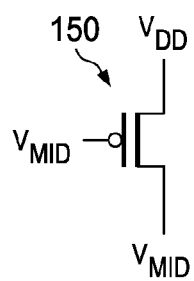

After operating the DUT 116 in the first stress condition for the predetermined amount of time, the switch control 112 can switch the operation of the DUT 116 from the first stress condition to a first measurement condition. In the first measurement condition, drain to source current ($I_{DS}$) can be swept and measured by a controller 108, such as the controller 108 illustrated and described with respect to FIG. 2. FIGS. 6A-6D illustrate the p-MOS 150 illustrated in FIGS. 3 and 4 during application of the measurement condition. As is illustrated in FIG. 6A, a logic '0' is applied to the gate and the source of the p-MOS 150 and $V_{DD}$ is applied to the drain of the p-MOS 150. In such a situation, $I_{DS}$ can be measured and recorded a first time by the controller 108. Additionally, as illustrated in FIG. 6B a mid-point voltage ($V_{MID}$), which can be equal to about $V_{DD}/2$ can be applied to the gate and source of the p-MOS 150, and $V_{DD}$ can be applied to the drain of the p-MOS 150. In this condition, $I_{DS}$ can be measured and recorded a second time by the controller 108.

Figure 6C:
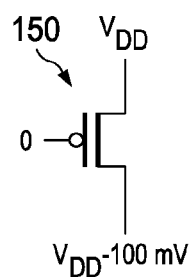
Figure 6D:
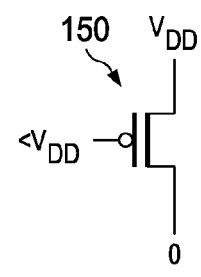

Further, as illustrated in FIG. 6C, a logic '0' can be applied to the gate of the p-MOS 150, while a reduced voltage which can be set to about $V_{DD}$-100 mV can be applied to the source of the p-MOS 150, and $V_{DD}$ can be applied to the drain. In this situation, $I_{DS}$ can be measured a third time. Yet further, as illustrated in FIG. 6D, a voltage less than $V_{DD}$ (labeled in FIG. 6D as "<$V_{DD}$") can be applied to the gate, a logic '0' can be applied to the source and $V_{DD}$ can be applied to the drain. In this condition, $I_{DS}$ can be measured and recorded a fourth time by the controller 108. It is to be understood that $I_{DS}$ can be measured multiple time in other orders as well.

Upon completing the first measurement condition, the switch control 112 can apply the recovery condition for some period of time (e.g., 24 hours). Moreover, similar to the application of the first stress condition, the test unit 102 can have the external heat continuously applied. After operating at the recovery condition for the period of time, the measurement condition can be repeated to again measure and record $I_{DS}$ four times, as illustrated in FIGS. 6A-6D (or some other number of times). By sweeping and measuring $I_{DS}$ after application of the first stress condition and/or the recovery condition, operational characteristics can be measured to determine an indication of degradation due to BTI and/or RTN. Additionally or alternatively, comparison of $I_{DS}$ values on other DUTs can be employed to measure process variations (t0).

Referring back to FIG. 3, additionally or alternatively, the switch control 112 can apply a second stress condition that can be similar to the first stress condition such as a condition illustrated and described with respect to FIG. 4. Moreover, upon application of the second stress condition for a predetermined amount of time (e.g., 24 hours), a second measurement condition (e.g., a TDDB measurement) can be applied to the DUT 116. In the second measurement condition, a gate of the DUT 116 can be measured as a gate current ($I_G$) is swept to identify a gate leakage. In one example, the DUT 116 can be implemented as the p-MOS 150 illustrated in FIGS. 4-6. To apply the second measurement condition (e.g., the TDDB measurement), the switch control 112 can apply either the stress condition illustrated in FIG. 4 or the measurement condition illustrated in FIG. 6A and a gate leakage of the DUT 116 can be measured and recorded a first time by the controller 108. Additionally, in the second measurement condition (e.g., the TDDB measurement) the switch control 112 can apply the condition illustrated in FIG. 6B to the DUT 116 and the gate leakage can be measured and recorded a second time by the controller 108. Further, in the second measurement condition, the switch control 112 can apply the condition illustrated in FIG. 6C and the gate leakage can be measured and recorded a third time. Further still, in the second measurement condition, the switch control 112 can apply the condition illustrated in FIG. 6D and the gate leakage can be measured and recorded a fourth time by the controller 108.

Figure 7:
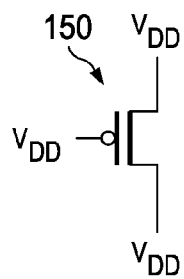
FIG. 7 illustrates an example of a semiconductor device with a disconnect condition applied.

The controller 108 can be configured to determine whether the gate current at the test unit 102 is above a threshold level, which can indicate that a "soft break" (or gate breakdown) of the DUT 116 has occurred. In such a situation, the controller 108 can cause the switch control 112 to apply a break condition to the DUT 116. The break condition can prevent further current from flowing through the DUT 116. In examples where the DUT 116 is implemented as the p-MOS 150 illustrated in FIGS. 4-6, the disconnect condition can be applied in a manner illustrated in FIG. 7. As is illustrated in the disconnect condition, $V_{DD}$ can be applied to the gate, source and drain of the p-MOS 150, such that the p-MOS 150 is in the off state and no voltage potential (or very little) between the drain and source of the p-MOS 150 exists.

Referring back to FIG. 2, the controller 108 can be configured to apply the first stress condition or the recovery condition to each of the N×M test units 102. Additionally, the controller 108 can be configured to individually control each test unit 102 to apply the first measurement condition (e.g., measurement for BTI, RTN and t0). Moreover, while a given (single) test unit 102 is put in the first measurement condition, the remaining test units 102 can remain in the first stress condition. The measured data received from the application of the first measurement condition at each of the test units 102 can be employed by the controller 108 or an external system to derive predictions related to performance degradation (e.g., reliability parameters) for devices similar to the DUTs. Such degradation parameters can include, but is not limited to BTI, RTN and/or t0 (process variations).

Additionally, the controller 108 can be configured to apply the second stress condition or the disconnect condition to each of the N×M test units 102 and the second measurement condition (e.g., measurement for TDDB). Moreover, while a given (single) test unit 102 is put in the measurement condition, the remaining test units 102 can remain in the second stress condition or the disconnect condition. The measured data received from the application of the second measurement condition at each of the test units 102 can be employed by the controller or an external system to derive predictions related to performance degradation such as TDDB.

Thus, by employment of the system 100, multiple degradation parameters, including BTI, RTN, t0 and/or TDDB can be predicted for devices similar to the DUTs. Moreover, by maintaining a stress condition (the first or second stress condition) on each DUT except the DUT being measured at a given time, the accuracy of the measured operational characteristics such as drain current to voltage ($I_D$-V), gate current to voltage ($I_G$-V), a threshold voltage ($V_{TH}$), a drain saturation current ($I_{DSAT}$), a drain linear current ($I_{DLIN}$) at a nominal operating voltage ($V_{NOM}$), etc. measured by the system can be increased.

Figure 8:
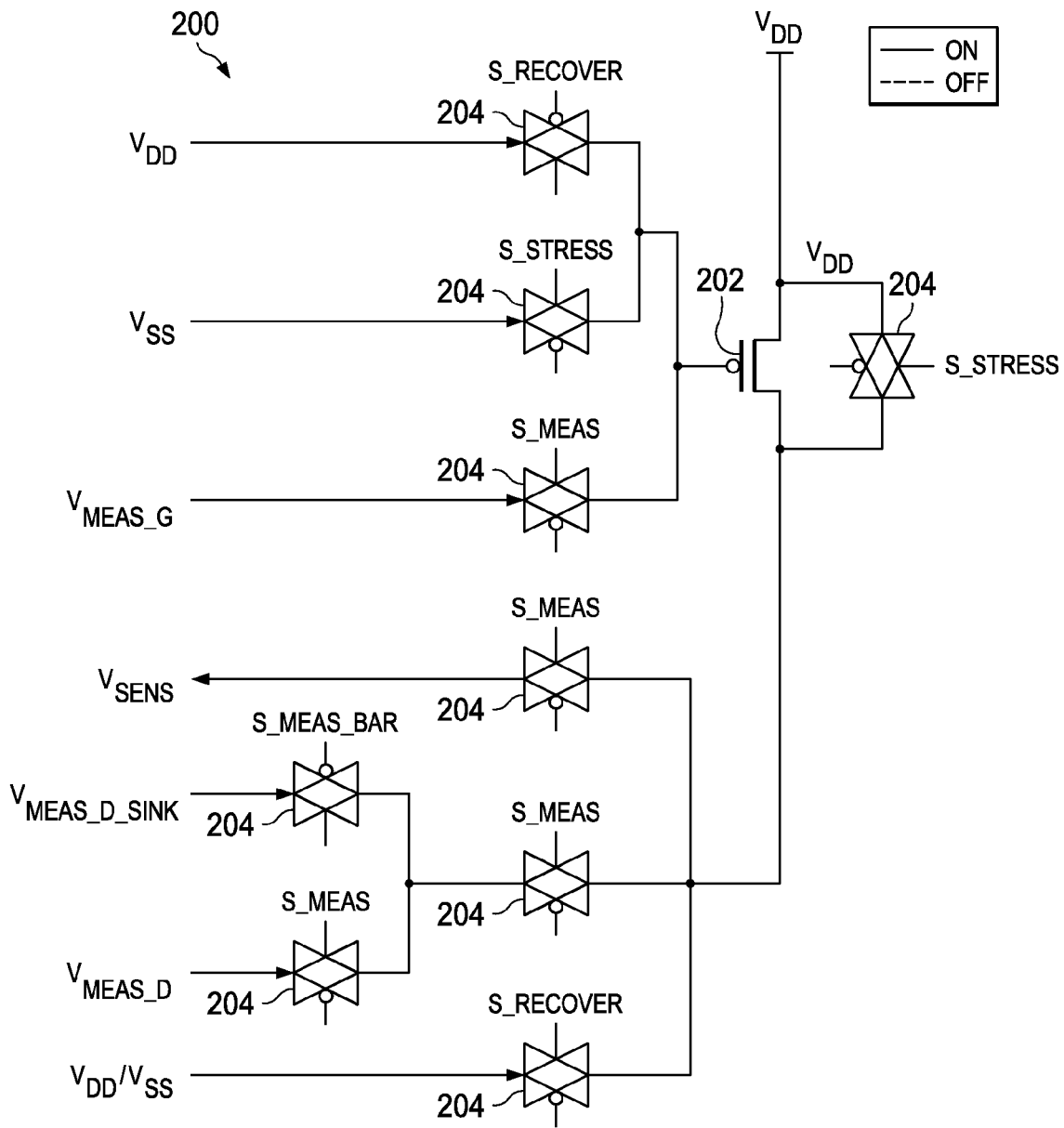
FIG. 8 illustrates an example of a test cell illustrated in FIG. 3.

FIG. 8 illustrates an example of a DUT cell 200 that can be employed, for example, to implement the DUT cell 114 illustrated in FIG. 2. In the present example, the DUT cell 200 includes a p-MOS 202 that can be tested to measure and record operational characteristics that can be employed to derive expected performance degradation for similar devices. The DUT cell 200 can include a plurality of switches 204 that can be controlled, for example, by a switch control, such as the switch control 112 of FIG. 2. The DUT cell 200 can receive a lower voltage rail signal (lower, with respect to $V_{DD}$) (labeled in FIG. 8 as and referred to as "$V_{SS}$") and a higher voltage rail signal (higher, with respect to $V_{SS}$) (labeled in FIG. 8 and referred to as "$V_{DD}$") that are controlled by corresponding switches 204. The switch corresponding to $V_{DD}$ can be controlled by a switch signal (labeled in FIG. 8 and referred to as S_RECOVER). The switch corresponding to $V_{SS}$ can be controlled by a switch signal, labeled in FIG. 8 and referred to as S_STRESS. $V_{SS}$ and $V_{DD}$ can be provided, for example, by an external power supply, such as including, but not limited to a controller. As an example, the voltage level of $V_{DD}$ and/or $V_{SS}$ can be set to a value of about 60% higher than a voltage rating of the p-MOS 202 to apply stress to the p-MOS 202. The corresponding switches 204 can be coupled to a gate of the p-MOS 202. A gate terminal measurement signal (labeled in FIG. 8 and referred to as "$V_{MEAS\_G}$") can be controlled by an associated switch 204 and also coupled to the gate of the p-MOS 202, which gate can be controlled by a switch signal labeled in FIG. 8 and referred to as "S_MEAS". $V_{MEAS\_G}$ can be, for example, a signal internal (local) to the DUT cell 200.

$V_{DD}$ can be provided to a drain of the p-MOS 202. Additionally, a drain to source switch 204 can be coupled to both the drain and the source of the p-MOS 202. The drain to source switch 204 can be controlled, for example, by S_STRESS. A parasitic drain sink signal (labeled in FIG. 8 and referred to as "$V_{MEAS\_D\_SINK}$") can be output to an external device (e.g., a controller or a sink) and such output can be controlled by an associated switch 204. The associated switch 204 can be controlled by a switch signal labeled in FIG. 8 and referred to as "S_MEAS_BAR". A drain measurement signal (labeled in FIG. 8 and referred to as $V_{MEAS\_D}$) can be received and controlled by an associated switch 204, which switch 204 can be controlled by a switch signal labeled in FIG. 8 and referred to as "S_MEAS". $V_{MEAS\_D}$ can be an internal signal (e.g., local) of the DUT cell 200. Additionally, S_MEAS can also be employed to control a measurement switch 204 coupled to the switch associated with $V_{MEAS\_D}$ and $V_{MEAS\_D\_SINK}$. The measurement switch 204 can be coupled to a source of the p-MOS 202.

A recovery/disconnect signal (labeled in FIG. 8 and referred to as "$V_{DD}/V_{SS}$") that can be implemented as either $V_{DD}$ or $V_{SS}$. $V_{DD}/V_{SS}$ can be controlled by an associated switch 204 that is coupled to the source of the p-MOS 202. The associated switch 204 can be controlled by S_RECOVER.

It is noted that the DUT cell 200 can be modified to accommodate other semiconductor devices, such as an n-MOS. For example, to test an n-MOS instead of a p-MOS 202, the DUT cell 200 can be modified such that the $V_{DD}$ signals can be replaced with $V_{SS}$ signals and the $V_{SS}$ signals can be replaced with $V_{DD}$ signals.

Figure 9:
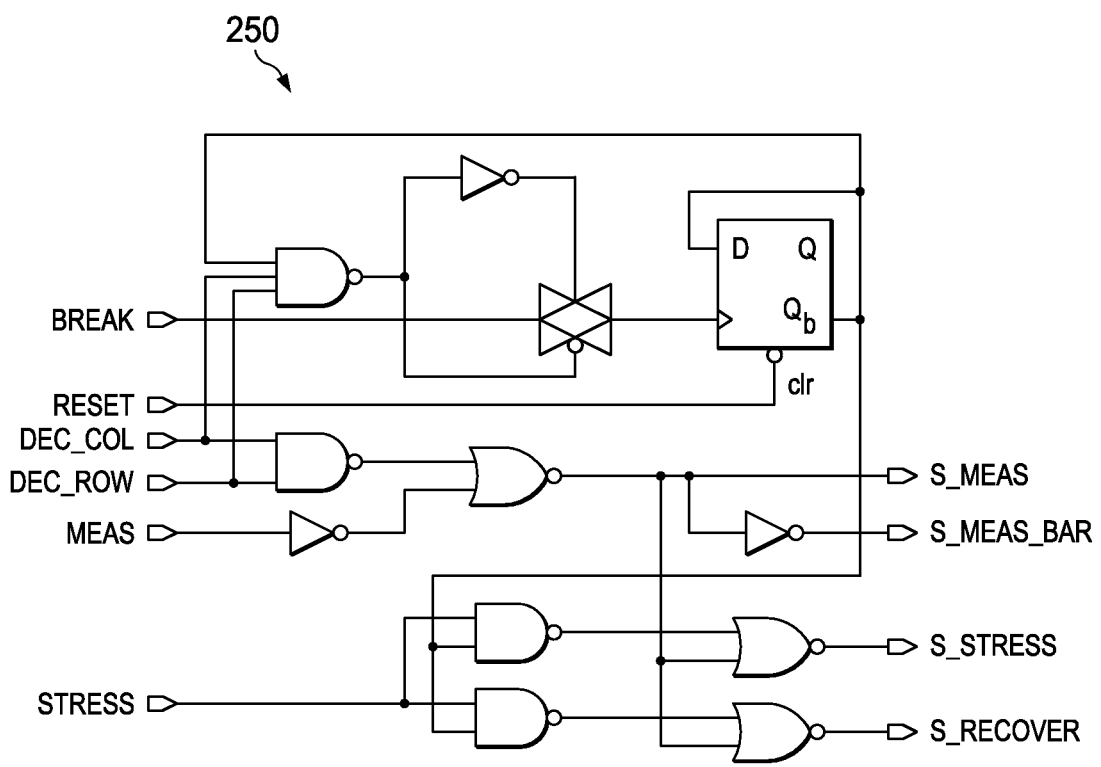
FIG. 9 illustrates an example of a switch control illustrated in FIG. 3.

FIG. 9 illustrates an example of a logic circuit 250 that can be employed, for example to implement the switch control 112 of the DUT cell 102 illustrated in FIG. 3. The logic circuit 250 can be employed to output the switch signals illustrated and referenced with respect to FIG. 8. In FIG. 8, decoder signals labeled in FIG. 9 and referred to as "DEC_COL" and "DEC_ROW" can be received from the column decoder 106 and the row decoder 104, respectively of FIGS. 2 and 3. The remaining signals, namely a break signal (labeled in FIG. 9 and referred to as "BREAK"), a reset signal (labeled in FIG. 9 and referred to as "RESET"), a measurement signal (labeled in FIG. 9 as "MEAS") and a stress signal (labeled in FIG. 9 and referred to as "STRESS") can be received from the controller 108 illustrated in FIGS. 2 and 3.

Table 1 lists a truth table for the logic circuit 250 that can be employed, for example, in a first test condition ("TEST 1") that can measure operational characteristics and determine, for example, BTI, RTN and t0 (process variations). Table 2 lists a truth table for the logic circuit 250 that can be employed, for example, in a second test condition ("TEST 2") that can be employed to measure operational characteristics that can be employed to determine TDDB. In Tables 1 and 2 the signal "DECODER" corresponds to an AND gate combination of the DEC_COL and DEC_ROW illustrated in FIG. 9. Moreover, the "BREAK" signal in Tables 1 and 2 has three states. A first state 'N' indicates that a gate leakage current is not used (Table 1). A second state, 'Y' indicates that the leakage current at DUT is at or above the threshold level, such that a break (e.g., a disconnection) of the DUT is needed. A third state 'D' indicates that a break of the DUT was previously executed, such that the DUT has been disconnected from the remaining portions of the logic circuit 250. Moreover, in the Tables 1 and 2, a value of 'x' indicates that the output switch signals do not depend on that input signal.

As is shown in Tables 1 and 2, the MEAS signal enables measuring of a DUT, the measurement signal overrides all controls (even a BREAK signal) when the DECODER signal is asserted. In the first test condition (the BTI, RTN and t0 test), the STRESS signal selects the stress condition or the recovery condition. In the second test condition (the test for TBBD), the STRESS signal is always asserted. Additionally, for purposes of simplicity of explanation, S_MEAS_BAR is omitted from Tables 1 and 2 since S_MEAS_BAR is the complement (e.g., logical inverse) of S_MEAS.

Moreover, the RESET signal is not shown in Tables 1 and 2. The RESET signal initiates the DUT cell (and other DUT cells in an array of DUT cells) to an initial state to connect the cells for the second test condition (the TDDB test).

TABLE 1

| TEST 1 | | | | | |
|---|---|---|---|---|---|
| DECODER | 1 | 1 | 1 | 0 | 0 |
| MEAS | 1 | 0 | 0 | X | X |
| STRESS | X | 1 | 0 | 1 | 0 |
| BREAK | N | N | N | N | N |
| S_MEAS | 1 | 0 | 0 | 0 | 0 |
| S_STRESS | 0 | 1 | 0 | 1 | 0 |
| S_RECOVER | 0 | 0 | 1 | 0 | 1 |

| TEST 1 | | | | | |
|---|---|---|---|---|---|
| DECODER | 1 | 1 | 1 | 0 | 0 |
| MEAS | 1 | 0 | 0 | X | X |
| STRESS | 1 | 1 | 1 | 1 | 1 |
| BREAK | Y/D | Y | D | Y | D |
| S_MEAS | 1 | 0 | 0 | 0 | 0 |
| S_STRESS | 0 | 0 | 0 | 1 | 0 |
| S_RECOVER | 0 | 1 | 1 | 0 | 1 |

Y: BREAK AT THE MOMENT
D: BREAK ALREADY DONE PREVIOUSLY

Figure 10:
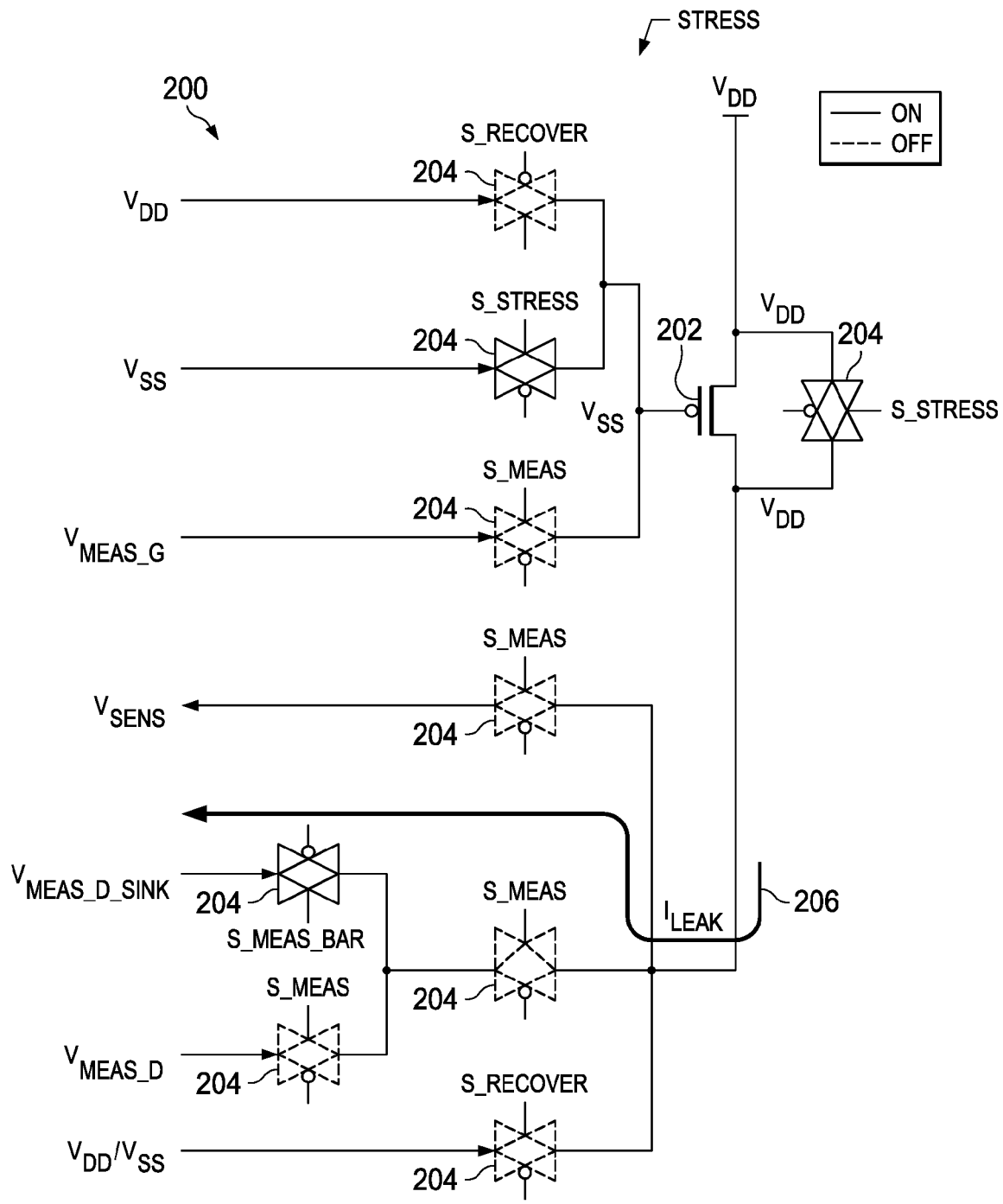
FIG. 10 illustrates an example of the test cell illustrated in FIG. 8 with a stress condition applied.

FIG. 10 illustrates the DUT cell 200 in FIG. 8 while the first stress condition (e.g., BTI, RTN and t0 stress) or the second stress condition (e.g., TDDB stress) is applied. In the first and second stress conditions, the switch 204 associated with $V_{SS}$ is turned on (e.g., closed state) by S_STRESS. Additionally, the switch 204 associated with $V_{MEAS\_D\_SINK}$ is turned on by S_MEAS and the drain to source switch 204 is also turned on by S_STRESS. The remaining switches 204 are turned off (e.g., open state). In this manner, $V_{SS}$ is asserted at the gate of the p-MOS, and $V_{DD}$ is asserted at the drain and source of the p-MOS. A leakage current (labeled in FIG. 8 and referred to as $I_{LEAK}$) propagates along a path generally indicated as arrow 206. $I_{LEAK}$ can represent, for example, gate leakage of the p-MOS. In this manner, $I_{LEAK}$ is steered away from other devices in a measurement path, thus ensuring a high degree of accuracy.

Figure 11:
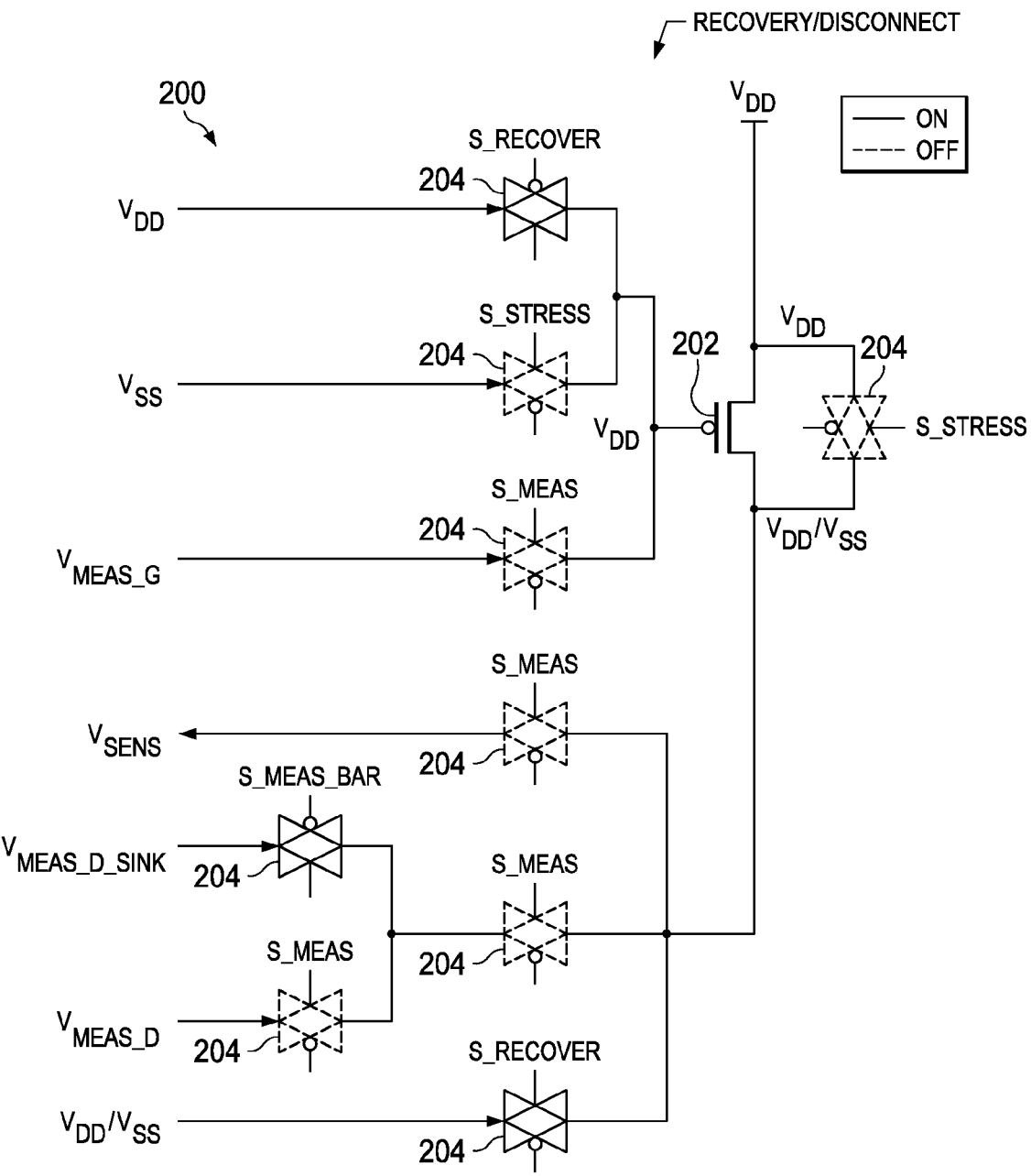
FIG. 11 illustrates an example of the test cell illustrated in FIG. 8 with a recovery/disconnect condition applied.

FIG. 11 illustrates the DUT cell 200 in FIG. 8 while the recovery condition (e.g., for the BTI, RTN and t0 test) is applied, which can also be referred to as a second stress condition, or the disconnect condition (e.g., for the TDDB test). In the recovery/disconnect condition, the switches associated with $V_{DD}$ and $V_{DD}/V_{SS}$ can be turned on (e.g., closed) by S_RECOVER. Moreover, the switch associated with $V_{MEAS\_D\_SINK}$ can be turned on by S_MEAS_BAR. The remaining switches can be turned off (e.g., opened). In such a situation, $V_{DD}$ can be asserted at the gate and drain of the p-MOS. Additionally, $V_{DD}/V_{SS}$ can be applied to the source of the p-MOS. In the recovery/disconnect condition, the p-MOS can be turned off.

Figure 12:
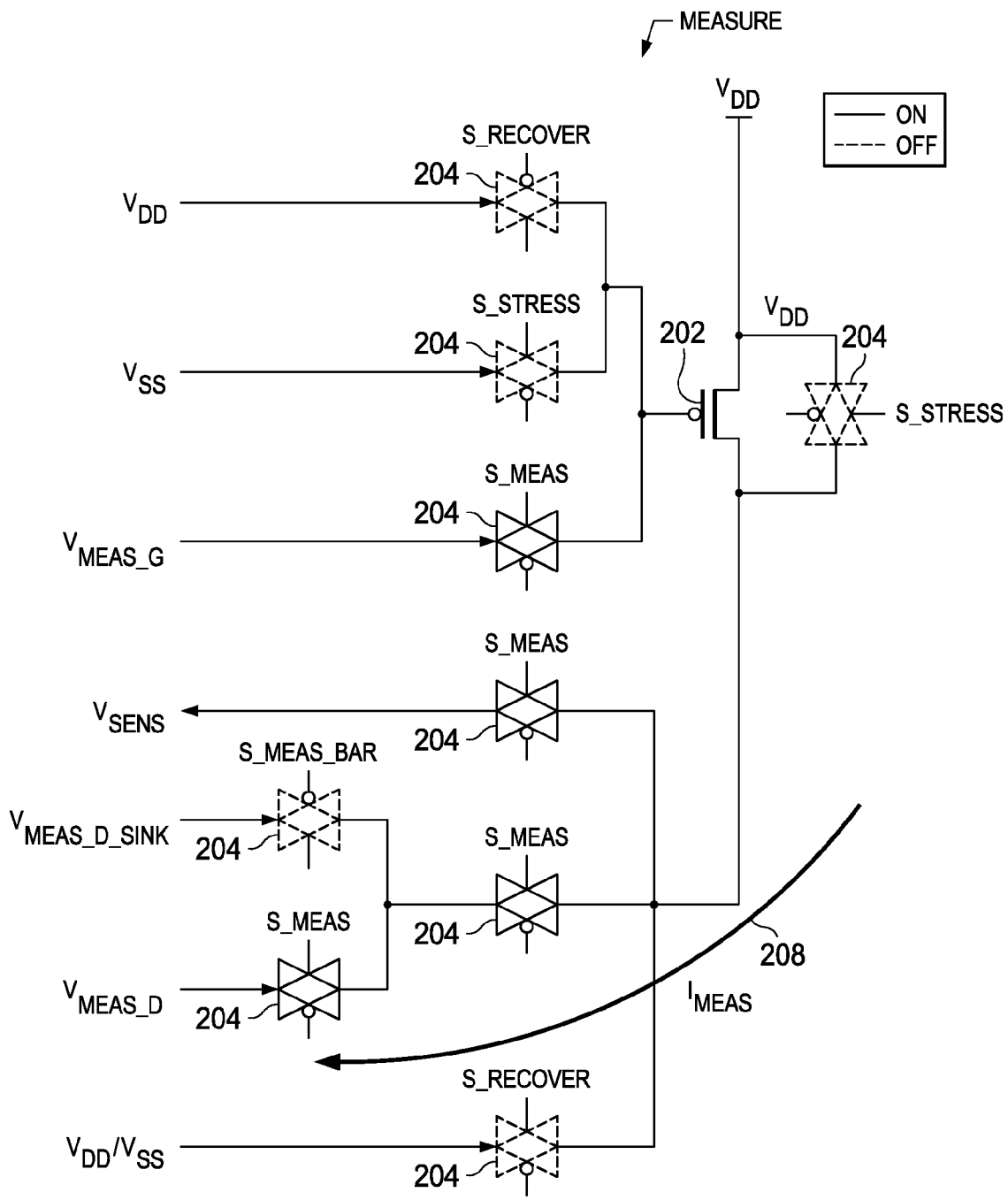
FIG. 12 illustrates an example of the test cell illustrated in FIG. 8 with a measurement condition applied.

FIG. 12 illustrates the DUT cell 200 in FIG. 8 while the first measurement condition (e.g., for the BTI, RTN and t0 test) or the second measurement condition (e.g., the gate measurement condition for the TDDB test) is applied. In the first and second measurement conditions, the switches associated with $V_{DD}$, $V_{MEAS\_D\_SINK}$ and $V_{DD}/V_{SS}$ are turned off (e.g., opened), and the remaining switches 204 are turned on by S_MEAS. In this manner, $V_{MEAS\_G}$ is asserted at the gate of the p-MOS and $V_{DD}$ is asserted at the drain of the P-MOS. Moreover, $V_{MEAS\_D}$ is asserted at the source of the P-MOS, and a measured current $I_{MEAS}$ can flow along a path generally indicated by an arrow 208. Moreover, a path to an output labeled in FIG. 8 and referred to as "$V_{SENS}$" allows for the sensing of node voltage. As explained, the first measurement condition can be employed, for example, to measure operational characteristics of the p-MOS 202 to determine effects of BTI, RTN and/or t0 (process variations), etc. due to stress (e.g., application of the first stress condition and/or the recovery condition). Additionally, as explained, the second measurement condition can be employed to measure operational characteristics that can be employed to determine the effects of TDDB due to stress (e.g., the application of the second stress condition).

Figure 13:
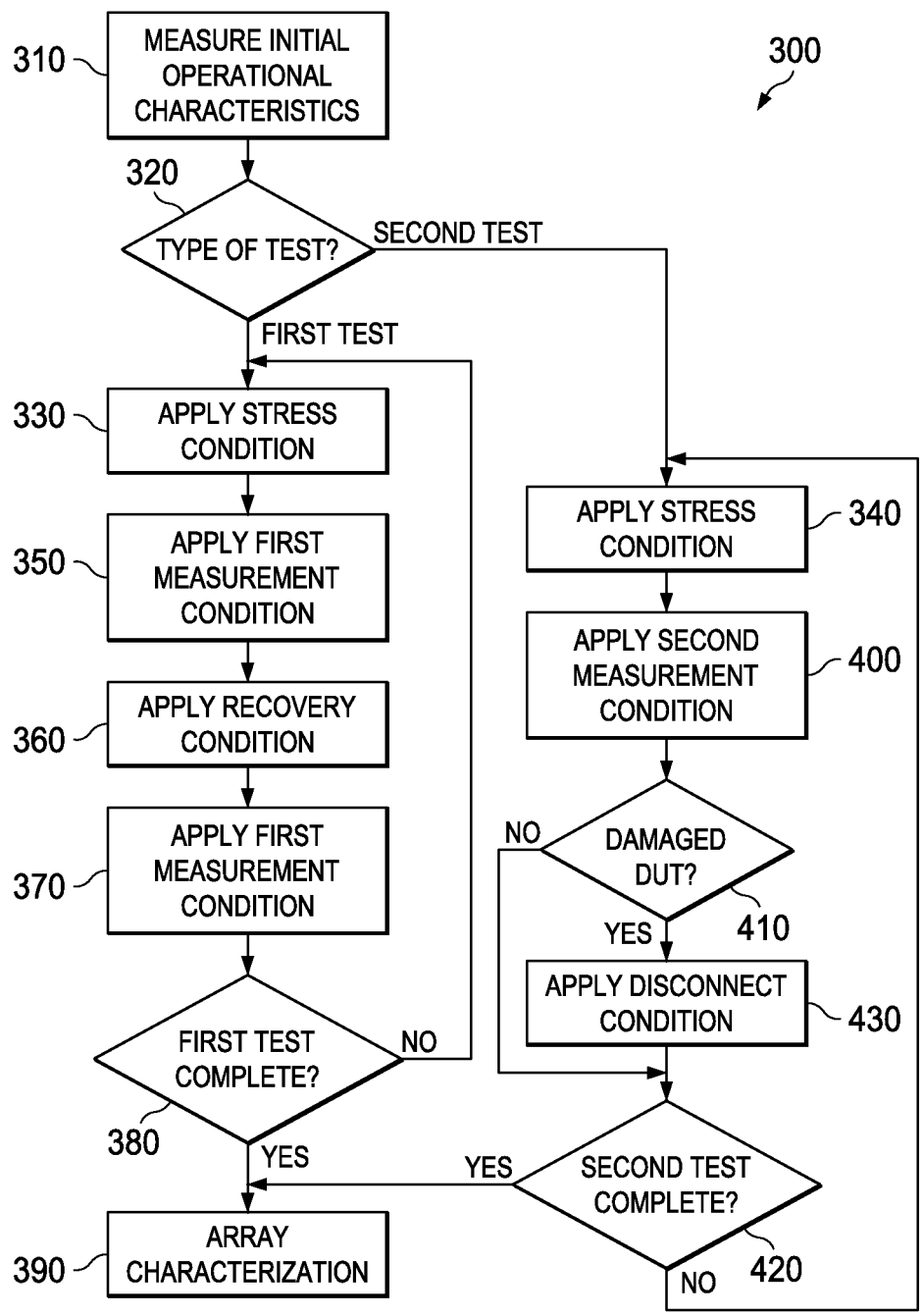
FIG. 13 illustrates an example of a flow chart of an example method of implementing a plurality of reliability tests on a plurality of semiconductor devices.

In view of the foregoing structural and functional features described above, example methods will be better appreciated with reference to FIG. 13. While, for purposes of simplicity of explanation, the example method of FIG. 13 is shown and described as executing serially, it is to be understood and appreciated that the presence examples are not limited by the illustrated order, as some actions could in other examples occur in different orders, multiple times and/or concurrently from that shown and described herein. Moreover, it is not necessary that all described actions be performed to implement a method. The example method of FIG. 13 can be implemented in a production test environment as machine executable instructions. The instructions can be accessed by a processing resource (e.g., one or more processor cores) and executed to perform the methods disclosed herein.

FIG. 13 illustrates an example of a method 300 for testing an array of DUTs. The method 300 can be implemented, for example, by the system 50 illustrated in FIG. 1 and/or the system 100 illustrated in FIG. 2. At 310, initial operational characteristics of each DUT in the array of DUTs can be tested and recorded at a controller. Such operational characteristics can include, but are not limited to drain current to voltage ($I_D$-V) and/or gate current to voltage ($I_G$-V) characteristics. Other operational characteristics, such as a threshold voltage ($V_{TH}$), a drain saturation current ($I_{DSAT}$), a drain linear current ($I_{DLIN}$) at a nominal operating voltage ($V_{NOM}$), etc. can also be measured and recorded at the controller.

At 320, a determination can be made as to the type of test being implemented. If the type of test being implemented is a first test condition (e.g., the test for BTI, RTN and t0), the method 300 can proceed to 330. If the type of test being implemented is a second test condition (e.g., the test for TDDB), the method 300 can proceed to 340.

At 330, a stress condition, such as a first stress condition can be applied to each DUT in the array of DUTs. The first stress condition can be applied (e.g., by the switch control 112 illustrated in FIG. 2 and/or the switch control 250 illustrated in FIG. 9) to each DUT cell (e.g., the DUT cell 200 illustrated in FIG. 8) in the manner similar to the condition illustrated and described with respect to FIG. 10. Moreover, in some examples, a stress voltage (e.g., an accelerated voltage), $V_{STR}$ can be applied as $V_{DD}$ in FIG. 10. For instance, $V_{STR}$ can be about 60% greater in voltage than a rated voltage for the DUT.

At 350, a first measurement condition can be applied individually to each DUT in the array of DUTs. The measurement condition can be applied by the switch control in a manner similar to the condition illustrated and described with respect to FIG. 12. During the measurement of each individual DUT, current to voltage ($I_D$-V) of each individual DUT can be measured and recorded by the controller. Moreover, each DUT except the DUT being measured can be kept in the first stress condition (FIG. 10) to avoid degradation recovery behavior.

At 360, a recovery condition can be applied to each DUT in the array of DUTs or individually. The recovery condition can be implemented in a manner similar to the condition illustrated and described with respect to FIG. 11. At 370, the first measurement condition can be applied individually at each DUT, wherein the current to voltage ($I_D$-V) can be re-measured and recorded by the controller. Moreover, the remaining DUTs not being measured can be kept in the recovery condition.

At 380, a determination can be made as to whether the first test (e.g., the BTI, RTN and t0 test) is complete. If the determination is negative (e.g., NO), the method 300 can return to 330. If the determination is positive (e.g., YES), the method can proceed to 390.

At 340, a second stress condition can be applied by the switch control. The second stress condition can be implemented in a manner similar to the condition illustrated in FIG. 10. Moreover, similar to 350, the stress voltage, $V_{STR}$ can be implemented as $V_{DD}$. At 400, a second measurement condition can be applied individually to each DUT in the array of DUTs. The second measurement condition can be applied to each DUT in a manner similar to the condition illustrated and described with respect to FIG. 12. In such a situation, gate current to voltage ($I_G$-V) characteristics of each individual DUT can be measured and recorded by the controller. Moreover, the DUTs in the array of DUTs other than the DUT being measured (and any DUT in the disconnect condition) can be kept in the second stress condition.

At 410, a determination can be made as to whether the gate current to voltage ($I_G$-V) is at or above a threshold level for any of the DUTs in the array of DUTs, which can indicate a damaged DUT (e.g., gate breakdown). If the determination at 410 is negative (e.g., NO) the method 300 can proceed to 420. If the determination at 410 is positive (e.g., YES), the method 300 can proceed to 430. At 430, a disconnect condition can be applied to the DUTs with a gate current at or above the threshold level. The disconnect condition can be implemented, for example, in a manner illustrated and described with respect to FIG. 11. At 420, a determination can be made as to whether the second test is complete. If the determination at 420 is negative (e.g., NO), the method can return to 340. If the determination at 420 is positive (e.g., YES), the method can proceed to 390.

At 390, an array characterization for the array of DUTs can be determined. The stress condition (e.g., the first stress condition or the second stress condition) can be removed from the array of DUTs and the statistical analysis of the measured and recorded operational characteristics (e.g., the drain current to voltage ($I_D$-V) and/or the gate current to voltage ($I_G$-V) can be analyzed to determine degradation parameters for each DUT in the array of DUTs. The degradation parameters for the plurality of DUTs can be employed by the controller (or other device) to predict degradation of performance (e.g., degradation and/or reliability parameters) of semiconductor devices that are fabricated in a manner similar to the DUTs.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system comprising:
a plurality of DUTs (device under test) and a plurality of switches configured to control a flow of current to the plurality of DUTs, wherein each of the plurality of the DUTs comprises an electronic component; and
a controller configured to execute a plurality of tests on the plurality of DUTs, wherein each of the plurality of tests comprises applying a measurement condition to a given DUT of the plurality of DUTs and concurrently applying a stress condition to the remaining DUTs of the plurality of DUTs, wherein the plurality of tests provide measurements sufficient to determine a bias thermal instability and a time dependent dielectric breakdown of the given DUT; and wherein the stress condition of the remaining DUTs of the plurality of DUTs is configured to shunt leakage current away from the given DUT.

2. The system of claim 1, wherein each of the plurality of DUTs comprises a semiconductor device.

3. The system of claim 2, wherein each of the plurality of DUTs comprises a p-channel metal-oxide-semiconductor field effect transistor (MOSFET).

4. The system of claim 2, wherein each of the DUTs in the plurality of DUTs comprise an n-channel metal-oxide-semiconductor field effect transistor (MOSFET).

5. The system of claim 1, wherein the plurality of tests further measure a random telegraph noise of the given DUT.

6. The system of claim 1, wherein the stress condition applies a voltage to each of the remaining plurality of DUTs that is higher or lower than a rated voltage of each of the plurality of DUTs.

7. The system of claim 1, wherein the plurality of tests further measure a process variation of the given DUT.

8. A method comprising:
applying a stress condition to a plurality of devices under test (DUTs);
applying a measurement condition to a given DUT in the plurality of DUTs while concurrently maintaining the stress condition on a remaining DUTs in the plurality of DUTs, wherein applying the stress condition is configured to shunt leakage current of the remaining DUTs away from the given DUT;
repeating the applying for each DUT in the plurality of DUTs; and
determining degradation parameters of each DUT in the plurality of DUTs.

9. The method of claim 8, wherein the operational characteristics for the plurality of DUTs comprise a bias temperature instability (BTI) and a temperature dependent dielectric breakdown (TDDB).

10. The method of claim 9, wherein the BTI and the TDDB are based on signals measured during separate applications of the measurement condition.

11. The method of claim 8, further comprising:
determining that a gate current for a particular DUT of the plurality of DUTs is at or above a threshold level; and
applying a disconnect condition to the particular DUT in response to the determining.

12. The method of claim 8, wherein the stress condition applies a stress voltage to a terminal of each of the plurality of DUTs, wherein the stress voltage is higher or lower than a voltage rating of each of the plurality of DUTs.

13. A method comprising:
applying a first test condition to a plurality of DUTs, wherein the first test condition comprises:
applying a first stress condition to each of the plurality of DUTs, wherein the first stress condition is configured to apply a stress voltage to each of the plurality of DUTs that is higher or lower than a rated voltage of each of the plurality of DUTs;
applying a first measurement condition to a given DUT of the plurality of DUTs while maintaining the first stress condition at each of the remaining DUTs of the plurality of DUTs;
measuring a drain current at the given DUT; and
repeating the applying of the first stress condition and the first measurement condition for each DUT in the plurality of DUTs; and
applying a second test condition to the plurality of DUTs, wherein the second test condition comprises:
applying a second stress condition to each of the plurality of DUTs, wherein the second stress condition is configured to apply the stress voltage to each of the plurality of DUTs;
applying a second measurement condition to a given DUT of the plurality of DUTs while maintaining the first stress condition at each of the remaining DUTs of the plurality of DUTs;
measuring a gate current at the given DUT; and
repeating the applying of the second stress condition and the second measurement condition for each DUT in the plurality of DUTs, wherein the first and second stress conditions are configured to shunt leakage current for each of the remaining DUTs of the plurality of DUTs current to a sink.

14. The method of claim 13, wherein the applying of the second test further comprises:
determining that a particular DUT of the plurality of DUTs has a gate current greater than a threshold level; and
applying a disconnect condition to the particular DUT.

15. The method of claim 13, further comprising determining expected degradation parameters characteristics for a DUT fabricated in a manner similar to each of the plurality of DUTs, wherein expected degradation parameters comprises at least two bias temperature instability (BTI), random telegraph noise (RTN), process variations and time dependent dielectric breakdown (TDDB).

16. The method of claim 13, wherein the expected degradation parameters are based on a statistical analysis of the measured drain current and the measured gate current in the first and second test conditions.

17. The method of claim 13, wherein the applying of the first test condition further comprises:
applying a recovery condition to each of the plurality of DUTs, wherein the recovery condition is configured to apply voltage to each of the plurality of DUTs that is lower than a rated voltage of each of the plurality of DUTs;
applying the first measurement condition to a given DUT of the plurality of DUTs while maintaining the recovery condition at each of the remaining DUTs of the plurality of DUTs;
measuring a drain current at the given DUT; and
repeating the applying of the recovery condition and the first measurement condition for each DUT in the plurality of DUTs.

* * * * *